(12) United States Patent
Shimada

(10) Patent No.: US 11,798,905 B2
(45) Date of Patent: Oct. 24, 2023

(54) SEMICONDUCTOR DEVICE AND METHOD FOR MANUFACTURING SEMICONDUCTOR DEVICE

(71) Applicant: LAPIS Semiconductor Co., Ltd., Yokohama (JP)

(72) Inventor: Takashi Shimada, Miyazaki (JP)

(73) Assignee: LAPIS SEMICONDUCTOR CO., LTD., Yokohama (JP)

( * ) Notice: Subject to any disclaimer, the term of this patent is extended or adjusted under 35 U.S.C. 154(b) by 205 days.

(21) Appl. No.: 17/488,053

(22) Filed: Sep. 28, 2021

(65) Prior Publication Data

US 2022/0102300 A1 Mar. 31, 2022

(30) Foreign Application Priority Data

Sep. 30, 2020 (JP) .................. 2020-165426

(51) Int. Cl.
*H01L 23/00* (2006.01)

(52) U.S. Cl.
CPC .............. *H01L 24/05* (2013.01); *H01L 24/03* (2013.01); *H01L 24/93* (2013.01);
(Continued)

(58) Field of Classification Search
CPC ......... H01L 24/05; H01L 24/03; H01L 24/93; H01L 2224/022; H01L 2224/03001; H01L 2224/03602; H01L 2224/05005; H01L 21/561; H01L 23/3114; H01L 29/0657; H01L 2224/02331; H01L 2224/0235; H01L 2224/02371; H01L 2224/02375; H01L 2224/02379; H01L 2224/0345; H01L 2224/0346; H01L 2224/0347; H01L 2224/0381; H01L 2224/03825; H01L 2224/0384; H01L 2224/0391; H01L 2224/05007; H01L 2224/05008;
(Continued)

(56) References Cited

U.S. PATENT DOCUMENTS

2006/0012033 A1* 1/2006 Noguchi ............. H01L 23/3114
438/126
2007/0123022 A1* 5/2007 Wakabayashi .......... H01L 24/05
257/E21.508
(Continued)

FOREIGN PATENT DOCUMENTS

JP 2006287048 A 10/2006

*Primary Examiner* — Douglas W Owens
(74) *Attorney, Agent, or Firm* — Rabin & Berdo, P.C.

(57) ABSTRACT

The semiconductor device according to the present invention comprises; a semiconductor element having one surface with a plurality of electrode pads; an electrode structure including a plurality of metal terminals and a sealing resin. The plurality of metal terminals being disposed in a region along a circumference of the one surface. The sealing resin holding the plurality of metal terminals and being disposed on the one surface of the semiconductor element. The electrode structure includes a first surface opposed to the one surface of the semiconductor element, a second surface positioned in an opposite side of the first surface, and a third surface positioned between the first surface and the second surface. Each of the plurality of metal terminals is exposed from the sealing resin in at least a part of the second surface and at least a part of the third surface.

7 Claims, 26 Drawing Sheets

(52) U.S. Cl.
CPC ............... *H01L 2224/022* (2013.01); *H01L 2224/03001* (2013.01); *H01L 2224/03602* (2013.01); *H01L 2224/05005* (2013.01)

(58) Field of Classification Search
CPC . H01L 2224/05147; H01L 2224/05166; H01L 2224/0519; H01L 2224/05548; H01L 2224/05558; H01L 2224/056; H01L 2224/94; H01L 2924/10156; H01L 23/3192; H01L 24/94
See application file for complete search history.

(56) References Cited

U.S. PATENT DOCUMENTS

| | | | |
|---|---|---|---|
| 2007/0158857 A1* | 7/2007 | Mihara | H01L 23/5389 257/E23.178 |
| 2009/0215258 A1* | 8/2009 | Watanabe | H01L 24/03 257/E21.585 |
| 2010/0144095 A1* | 6/2010 | Koroku | H01L 23/3135 257/E21.499 |
| 2010/0244209 A1* | 9/2010 | Fukushima | H01L 21/568 438/123 |

* cited by examiner

SEMICONDUCTOR DEVICE AND METHOD FOR MANUFACTURING SEMICONDUCTOR DEVICE

BACKGROUND

1. Technical Field

The present invention relates to a semiconductor device, especially, a semiconductor device of Wafer Level-Chip Size Package (WL-CSP) and a method for manufacturing the same.

2. Description of the Related Art

Recently, because of reduction in size of semiconductor devices, there has been known a WL-CSP in which a packaging process is performed in a state where semiconductor elements formed on a silicon wafer are still in a wafer state and respective sizes of the formed semiconductor devices directly become the sizes of the packages.

For example, JP-A-2006-287048 discloses a semiconductor device that includes electrodes formed of solder balls arranged in a grid pattern via rewiring on a surface of a semiconductor chip.

SUMMARY

However, when the electrodes are arranged in a grid pattern on an electrode formation surface of the semiconductor device, it is difficult to visually confirm a mounting state when the semiconductor device is mounted to a mounting board in some cases.

The present invention has been made in consideration of the above-described problem, and has an object to provide a WL-CSP semiconductor device that allows easy visual confirmation of a mounted state of the semiconductor device after mounted to a mounting board and a method for manufacturing the same.

A semiconductor device according to the present invention includes a semiconductor element and an electrode structure. The semiconductor element has one surface with a plurality of electrode pads made of a conductor. The electrode structure includes a plurality of metal terminals made of a conductor and a sealing resin. The plurality of metal terminals are disposed in a region along a circumference of the one surface on the one surface and electrically connected to the respective plurality of electrode pads. The sealing resin holds the plurality of metal terminals and is disposed on the one surface of the semiconductor element to cover the one surface. The electrode structure includes a first surface opposed to the one surface of the semiconductor element, a second surface positioned in an opposite side of the first surface, and a third surface positioned between the first surface and the second surface and continuous with the second surface. Each of the plurality of metal terminals is exposed from the sealing resin in at least a part of the second surface and at least a part of the third surface.

A method for manufacturing a semiconductor device according to the present invention includes: forming an electrode structure on a semiconductor element having one surface with a plurality of electrode pads made of a conductor, the electrode structure including a plurality of metal terminals made of a conductor and a sealing resin, the metal terminals being disposed in a region along a circumference of the one surface on the one surface and electrically connected to the respective plurality of electrode pads, the sealing resin holding the plurality of metal terminals and being formed on the one surface of the semiconductor element to cover the one surface, the electrode structure including a first surface opposed to the one surface and a second surface positioned in an opposite side of the first surface; exposing each of the plurality of metal terminals from the sealing resin in at least a part of the second surface of the electrode structure and at least a part of a third surface positioned between the first surface and the second surface and continuous with the second surface; and individualizing a plurality of the semiconductor devices formed on a wafer.

BRIEF DESCRIPTION OF THE DRAWINGS

Features of the present invention will be described below with reference to the accompanying drawings.

DETAILED DESCRIPTION

Figure 1:
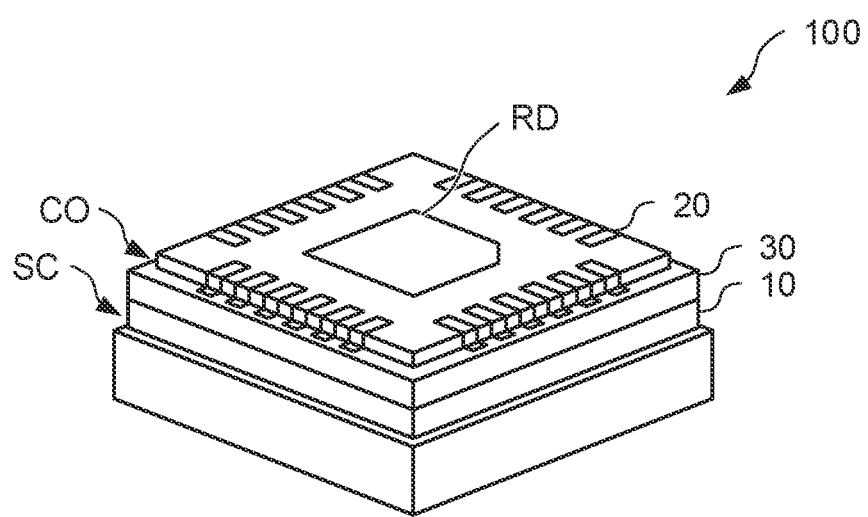
FIG. 1 is a perspective view of a semiconductor device according to an embodiment of the present application.

Embodiments of the present invention will be described in detail below. Note that the same reference numerals are given to substantially the same or equivalent parts in the following description and the accompanying drawings. In the following description, a description of "material 1/material 2" means a laminated structure in which a material 2 is laminated on a material 1. A description of "material 1-material 2" means an alloy of materials 1 and 2, and a description of "material 1-material 2-material 3" or "material 1 material 2 material 3" means an alloy of materials 1 to 3.

Embodiment

Figure 2:
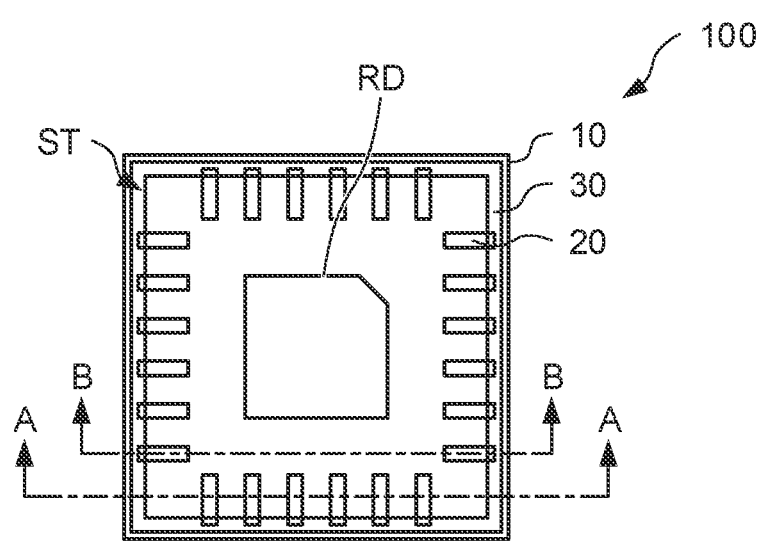
FIG. 2 is a top view of the semiconductor device according to the embodiment of the present application.
Figure 3:
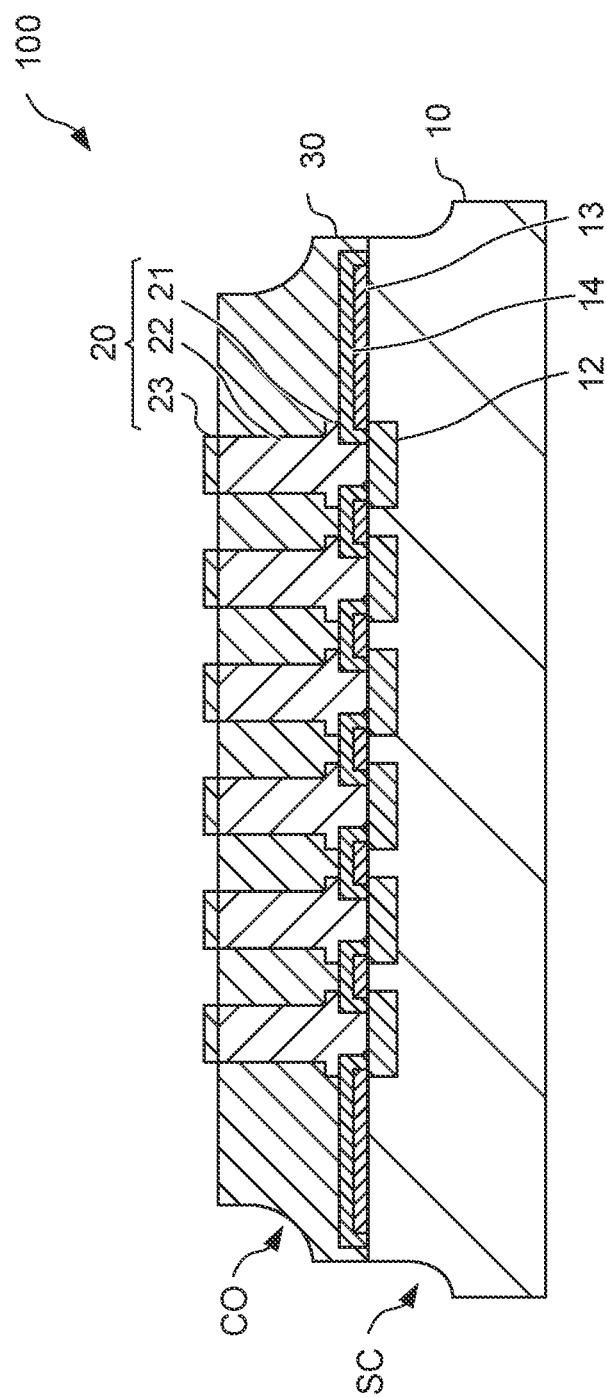
FIG. 3 is a cross-sectional view of the semiconductor device according to the embodiment of the present application.
Figure 4:
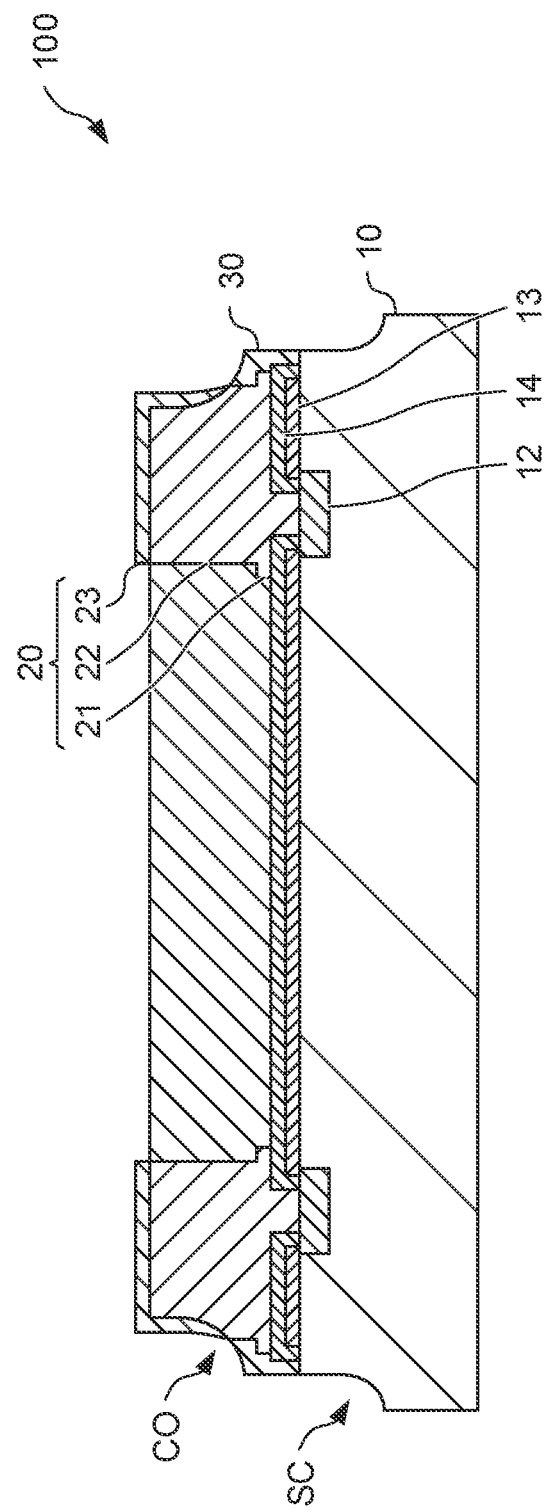
FIG. 4 is a cross-sectional view of the semiconductor device according to the embodiment of the present application.

FIG. 1 is a perspective view of a semiconductor device 100 according to the embodiment of the present application. FIG. 2 is a top view of the semiconductor device 100 according to Embodiment 1 of the present application. FIG. 3 and FIG. 4 are cross-sectional views of the semiconductor device 100 according to Embodiment 1 of the present application taken along a line A-A and a line B-B of FIG. 2.

The semiconductor device 100 includes a semiconductor element 10, electrode posts 20 formed on electrode pads 12 disposed on an upper surface as a device surface of the semiconductor element 10, and a sealing resin 30 formed to cover the upper surface of the semiconductor element 10. Upper surfaces and side surfaces of the electrode posts 20 are at least partially exposed from the sealing resin 30. In this embodiment, for easy understanding, the description will be given having a surface of the semiconductor device 100 from which the electrode posts 20 are exposed as the upper surface. The upper surface of the semiconductor device 100 is a mounting surface to the mounting board. That is, the semiconductor device 100 is mounted to the mounting board with the upper surface and the lower surface inverted to connect the electrode posts 20 to terminals of the mounting board. Furthermore, the semiconductor device 100 includes a heatsink RD in the center of the upper surface.

The semiconductor element 10 is a semiconductor chip of Large Scale Integration (LSI), such as a microcontroller and a device driver, in which an electronic circuit is formed on an upper surface of a semiconductor substrate of Si or the like or a semiconductor IC, such as Metal Oxide Semiconductor Field Effect Transistor (MOSFET). The semiconductor element 10 is provided with a cutout SC along four sides of the upper surface of the substrate, and furthermore, a cutout structure CO is formed along four sides of the upper surface of the semiconductor device 100. In the embodiment, the description will be given with a case where the semiconductor element 10 is a semiconductor chip formed by forming electronic circuits on one principal surface (corresponding to the upper surface of the semiconductor element 10) of a silicon wafer and individualizing them.

As illustrated in FIG. 3 and FIG. 4, the semiconductor element 10 includes the electrode pads 12 arranged along the four sides of the upper surface. The respective electrode pads 12 are formed to be separated from end portions of the four sides of the upper surface of the semiconductor element 10. The electrode pad 12 is, for example, a conductive metal containing aluminum (Al) or the like as a main material, or a conductive alloy film containing aluminum-silicon (Al—Si), aluminum-silicon-copper (Al—Si—Cu), or the like as a main material.

As illustrated in FIG. 3 and FIG. 4, the semiconductor element 10 includes a surface protection film 13 that covers the device surface of the semiconductor element 10 and is provided with openings for at least parts of the respective electrode pads 12. The surface protection film 13 is silicon nitride (SiN) or an insulating film of an oxide film or the like. The surface protection film 13 is a passivation film formed in manufacturing the semiconductor element 10. In the embodiment, a case where the surface protection film 13 is SiN will be described.

An insulating film 14 is a film made of an insulating material. The insulating film 14 is formed on the surface protection film 13 of the semiconductor element 10, covers the upper surface and the side surfaces of the surface protection film 13, and is provided with openings from which the upper surfaces of the electrode pads 12 are exposed. The insulating film 14 is an insulating resin film of polyimide (PI), polybenzoxazole (PBO), or the like.

The electrode posts 20 are metal terminals in approximately rectangular parallelepiped shapes disposed to be in contact with the respective upper surfaces of the electrode pads 12 of the semiconductor element 10. The electrode posts 20 are arranged along each of the four sides of the upper surface of the semiconductor element 10.

As illustrated in FIG. 4, the electrode post 20 covers the surface of the electrode pad 12 exposed from the insulating film 14, and extends to the upper surface of the insulating film 14 in the periphery of the exposed surface. As illustrated in FIG. 4, the electrode post 20 is formed to extend from the electrode pad 12 to the proximity of the side of the semiconductor element 10 close to this electrode pad 12. The electrode post 20 includes overhung protrusions projected to extend to regions on the insulating film 14 in the periphery of the opening of the insulating film 14 from which the electrode pad 12 is exposed.

In other words, as illustrated in FIG. 3 and FIG. 4, the electrode post 20 includes a post base portion 21 with the overhung protrusions in a lower portion of the electrode post 20 and a post main body 22 formed to have side surfaces positioned inside the protrusions of the post base portion 21 and extend to the upper surface of the semiconductor device 100. Furthermore, an antioxidation film 23 is formed on the upper surface of the post main body 22. The post base portion 21 and the post main body 22 are conductors made of metal, such as copper (Cu), and the post base portion 21 and the post main body 22 function as metal terminals in the embodiment. In the embodiment, a case where the post base portion 21 and the post main body 22 are Cu will be described. The antioxidation film 23 is, for example, a thin film of solder, nickel-gold (Ni—Au), nickel-palladium-gold (Ni—Pd—Au), or tin (Sn). While a case where the antioxidation film 23 is Sn will be described in the embodiment, the antioxidation film 23 is not limited to Sn.

The sealing resin 30 is a portion made of a resin material that covers the upper surface of the semiconductor element 10 and is formed such that the upper surfaces and the side surfaces of the electrode posts 20 are partially exposed, that is, the upper surfaces and the side surfaces of the post main bodies 22 are partially exposed. The sealing resin 30 is, for example, an insulating resin in which an epoxy resin is mixed with a black pigment and silicon dioxide ($SiO_2$).

As illustrated in FIG. 3, the sealing resin 30 is provided with a cutout portion forming a part of a cutout structure CO formed from the upper ends of the side surfaces. As illustrated in FIG. 4, each of the post main body 22 and the sealing resin 30 is provided with the cutout, and the cutout of the post main body 22 and the cutout of the sealing resin 30 form a cutout portion forming a part of the cutout structure CO. The cutout portion formed of the cutout of the post main body 22 and the cutout of the sealing resin 30 has a shape similar to the cutout portion of the sealing resin 30.

The cutout structure CO has a uniform surface formed of the sealing resin 30 and the post main body 22. In other words, the cutout portion of the sealing resin 30 and the cutout portion formed of the cutout of the post main body 22 and the cutout of the sealing resin 30 form the cutout structure CO extending along the four sides of the upper surface of the semiconductor device 100. In the upper surface and the cutout structure CO of the semiconductor device 100, at least a part of the post main body 22, the upper surface and the cutout of the post main body 22 in the embodiment, is formed to be exposed from the sealing resin 30. Then, the antioxidation film 23 is formed to cover the upper surface and the cutout of the post main body 22 formed to be exposed from the sealing resin 30. The electrode post 20 functions as a contact point of an external electrode that electrically connects the electrode pad 12 of the semiconductor element 10 to a mounting board (not illustrated) on the exposed surface. The electrode post 20 and the sealing resin 30 function as an electrode structure.

The heatsink RD is connected to the mounting board similarly to the electrode post 20. In the embodiment, a case where the heatsink RD is not electrically connected to any of the electrode pads 12 of the semiconductor element 10 will be described. That is, the heatsink RD releases a heat generated in the driving of the semiconductor element 10 to the mounting board. In addition, the mounting strength property can be enhanced.

As described above, the semiconductor device 100 of the embodiment is a Fan-in type CSP in which the external terminals including the electrode posts 20 are formed inward from the outer circumference of the semiconductor element 10 in top view. While a description will be given in the manufacturing method below, the semiconductor device 100 is a WL-CSP manufactured on a silicon wafer with the above-described configuration.

Since the semiconductor device 100 has a package form without a lead frame, the configuration does not require a wire connection by wire bonding. Accordingly, a wiring resistance from the electrode pad 12 of the semiconductor element 10 to the mounting electrode of the mounting board can be reduced.

In the semiconductor device 100 of the embodiment, the electrode posts 20 as the external terminals are disposed on the outer circumference of the mounting surface of the semiconductor device 100 and exposed from the side surfaces of the semiconductor device 100. Accordingly, after mounting the semiconductor device 100 to the mounting board, the mounted state of the semiconductor device 100 can be visually confirmed. In the side surface of the semiconductor device 100 from which the electrode post 20 is exposed, the electrode post 20 includes the antioxidation film 23 made of Sn. This allows formation of a fillet with which a solder as a binder creeps up to the side surface of the electrode post 20 when mounting the semiconductor device 100 to the mounting board, thus allowing the improvement of mounting reliability of the semiconductor device 100 to the mounting board.

As described above, the semiconductor device 100 includes the semiconductor element 10 including a plurality of electrode pads 12 formed of conductors on one surface, and the electrode structure including the post base portions 21 and the post main bodies 22 as a plurality of metal terminals formed of conductors and the sealing resin 30. The plurality of metal terminals are disposed in the region along the circumference of the one surface on the one surface, and electrically connected to the respective plurality of electrode pads 12. The sealing resin 30 holds the plurality of metal terminals and is disposed on the one surface of the semiconductor element 10 to cover the one surface. The electrode structure includes a first surface opposed to the one surface of the semiconductor element 10, a second surface positioned in the opposite side of the first surface, and a third surface positioned between the first surface and the second surface and continuous with the second surface. Each of the plurality of metal terminals is exposed from the sealing resin 30 in at least a part of the second surface and at least a part of the third surface.

The side surfaces of the post main bodies 22, as parts of the plurality of metal terminals, are partially covered with the sealing resin 30 from the end portions near the semiconductor device 100. The electrode structure is provided with the cutout structure CO formed along the circumference of the upper surface of the semiconductor device 100, and the post main bodies 22 are exposed from the sealing resin 30 in the cutout structure CO. The antioxidation film 23 that covers at least a part of the exposed surfaces of the post main bodies 22 is disposed. The semiconductor device 100 is a WL-CSP.

In the embodiment, the case where the side surfaces of the post main body 22 of the electrode post 20 are formed to be positioned inside the side surfaces of the post base portion 21 is described. However, the side surfaces of the post main body 22 may be formed along the side surfaces of the post base portion 21.

In the embodiment, the description has been given of the case where the electrode pads 12 of the semiconductor element 10 are disposed inside the respective end portions of the four sides of the upper surface of the semiconductor element 10 in the directions along the respective four sides, and the electrode posts 20 are formed on the upper surfaces of the respective electrode pads 12. However, the arrangement state of the electrode pads 12 is not limited to this. For example, it is only necessary that the electrode pads 12 are disposed on the upper surface of the semiconductor element 10, the electrode posts 20 are formed on the electrode pads 12 so as to extend to the proximity of any side of the semiconductor device 100, and the electrode posts 20 are exposed from the side surface of any side of the semiconductor device 100.

Next, a manufacturing procedure of the semiconductor device 100 according to the embodiment of this application will be described using FIG. 5 to FIG. 23.

Figure 5:
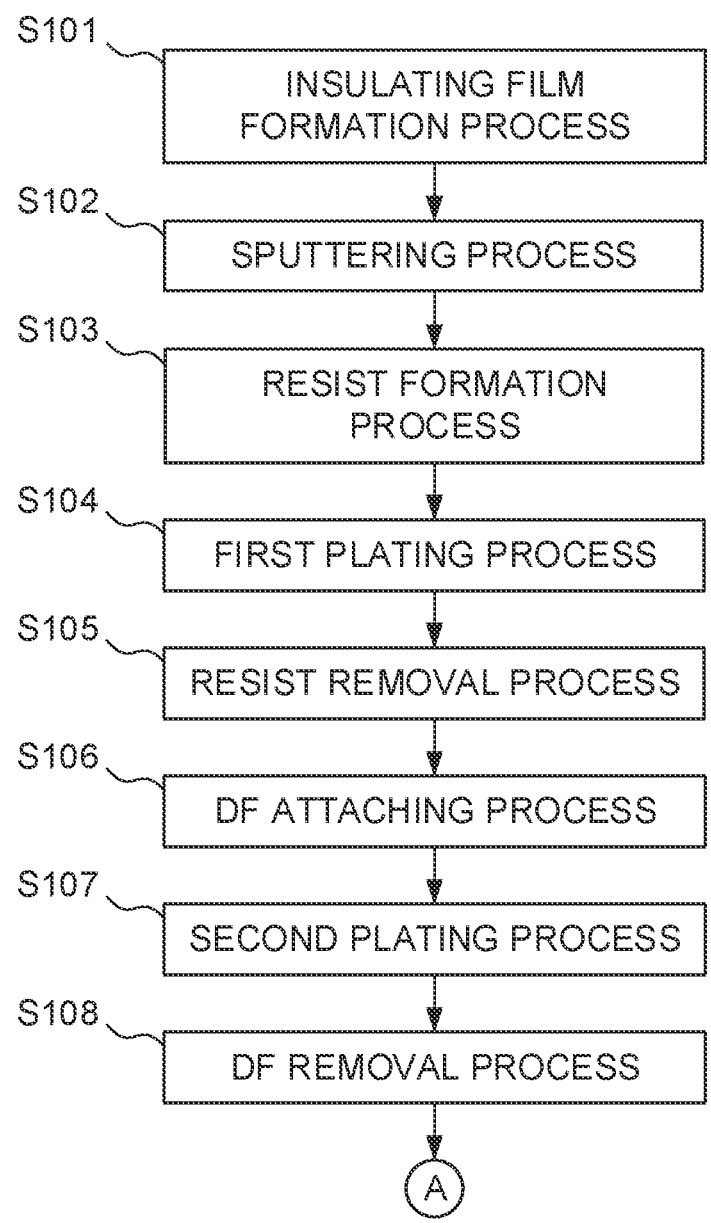
FIG. 5 is a flowchart illustrating a manufacturing procedure of the semiconductor device according to the embodiment of the present application.
Figure 6:
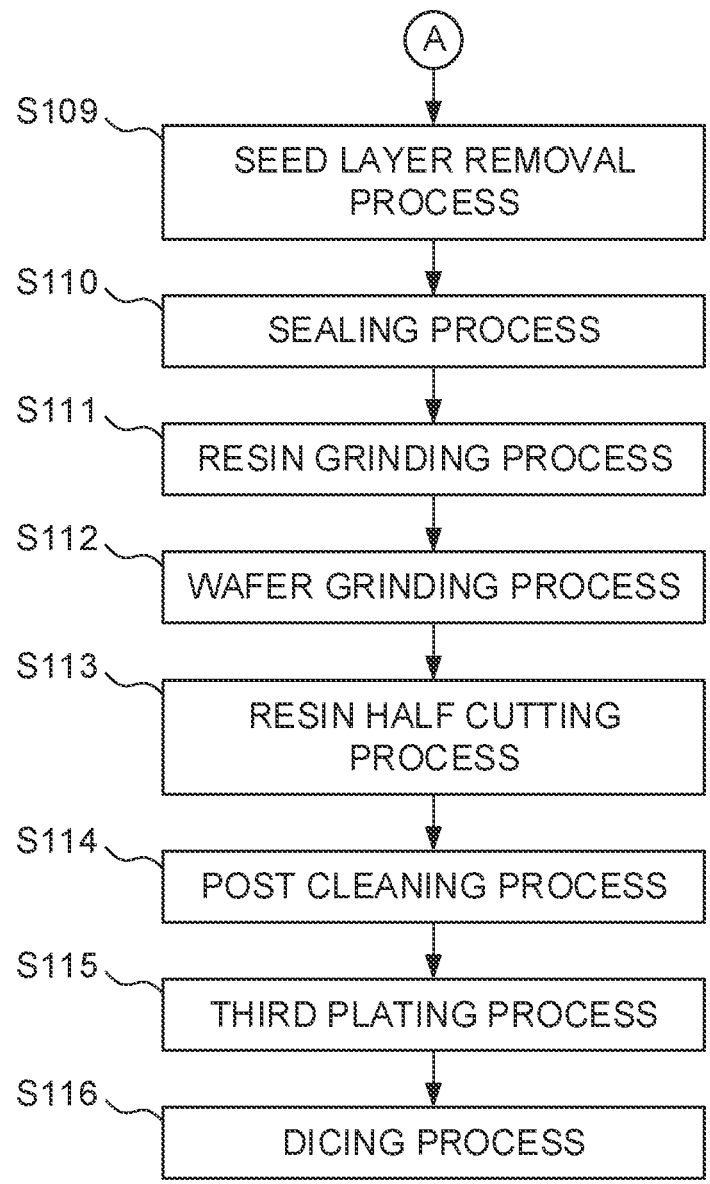
FIG. 6 is a flowchart illustrating a manufacturing procedure of the semiconductor device according to the embodiment of the present application.
Figure 7:
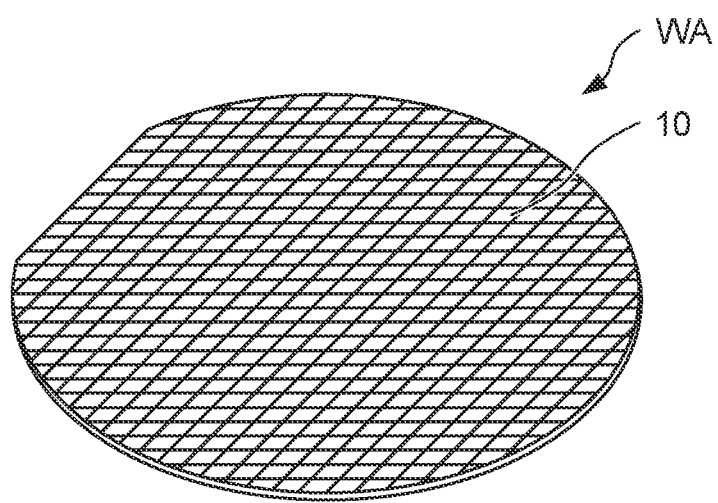
FIG. 7 is a drawing illustrating a wafer state in one step in manufacturing the semiconductor device according to the embodiment of the present application.

FIG. 5 and FIG. 6 illustrate flowcharts of the manufacturing procedure of the semiconductor device 100 according to Embodiment 1 of this application. FIG. 7 and FIG. 22 are perspective views of the entire wafer during manufacturing the semiconductor device 100 at respective steps in the manufacturing procedure illustrated in FIG. 5 and FIG. 6. FIG. 8 to FIG. 21, and FIG. 23 are cross-sectional views of the semiconductor device 100 at respective steps in the manufacturing procedure illustrated in FIG. 5 and FIG. 6. The cross-sectional views of FIG. 8 to FIG. 21, and FIG. 23 illustrate cross-sectional surfaces in regions between devices of the semiconductor device 100 before individualization, and illustrate cross-sectional surfaces corresponding to the cross-sectional surface taken along the line B-B of the semiconductor device 100 of FIG. 1.

Figure 8:
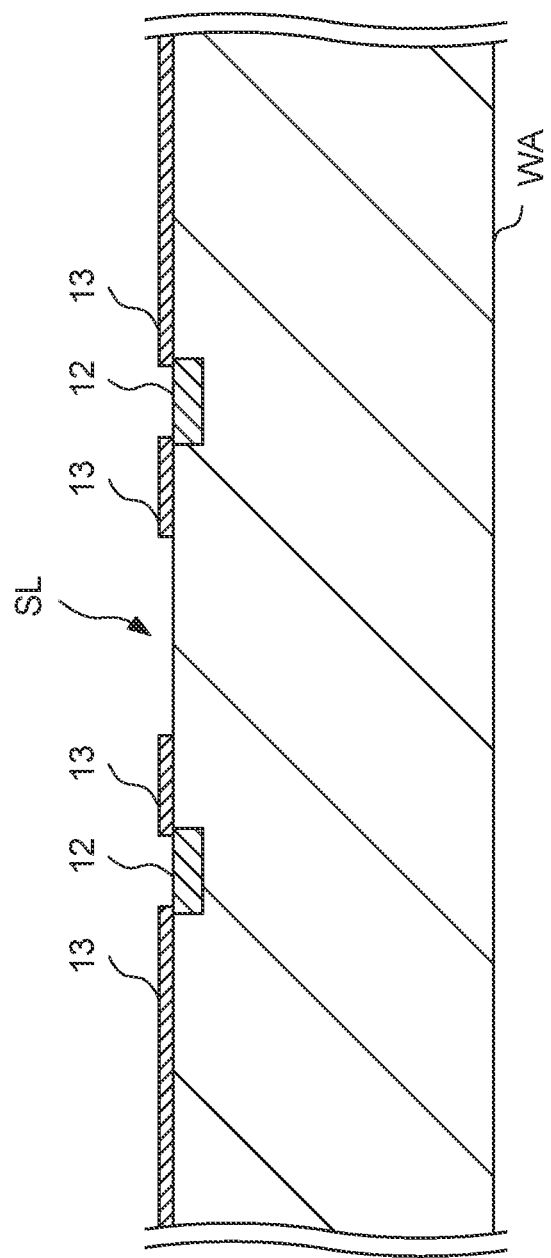
FIG. 8 is a cross-sectional view in one step in manufacturing the semiconductor device according to the embodiment of the present application.

FIG. 7 is a perspective view of a wafer WA after a diffusion process of the semiconductor element 10. As illustrated in FIG. 7, a plurality of semiconductor elements 10 are formed in a grid pattern on one principal surface of the wafer WA after the diffusion process. FIG. 8 illustrates a cross-sectional surface of the wafer WA. As illustrated in FIG. 8, the semiconductor elements 10 are continuously arranged. On the upper surfaces of the plurality of semiconductor elements 10, the electrode pads 12 and the surface protection films 13 are formed. In FIG. 8, a part on which the surface protection film 13 is not formed is a scribe line SL as a dicing position of each semiconductor element 10. In this embodiment, a width of the scribe line SL of the semiconductor element 10 is about 80 μm.

Figure 9:
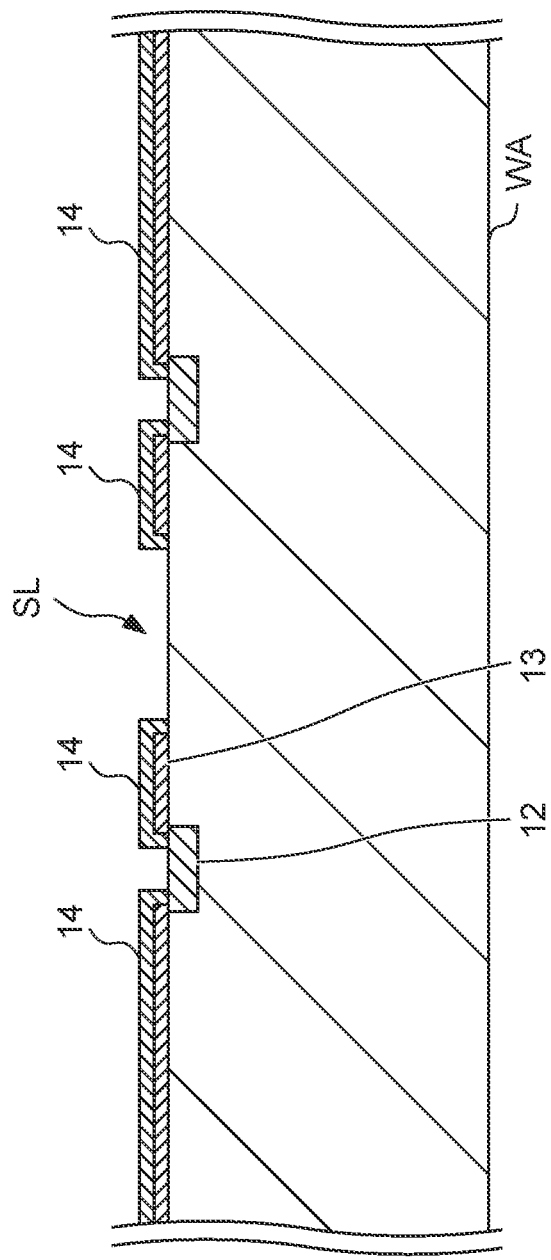
FIG. 9 is a cross-sectional view in one step in manufacturing the semiconductor device according to the embodiment of the present application.

On the wafer WA, as illustrated in FIG. 9, the insulating film 14 that covers the upper surface and the side surfaces of the surface protection films 13 and is provided with openings for at least parts of the electrode pads 12 is formed (Step S101). For the insulating film 14, for example, photosensitive polyimide is applied over the one principal surface, on which the electrode pads 12 have been formed, of the cleaned wafer WA. Exposure and development of the applied photosensitive polyimide are performed to open the openings for the electrode pads 12, thus removing the photosensitive polyimide of the opening.

Next, a plating seed layer of titanium/copper (Ti/Cu) is formed on the surface of the wafer WA, on which the insulating film 14 has been formed, by sputtering (Step S102). In the following drawings, the seed layer is not illustrated.

Figure 10:
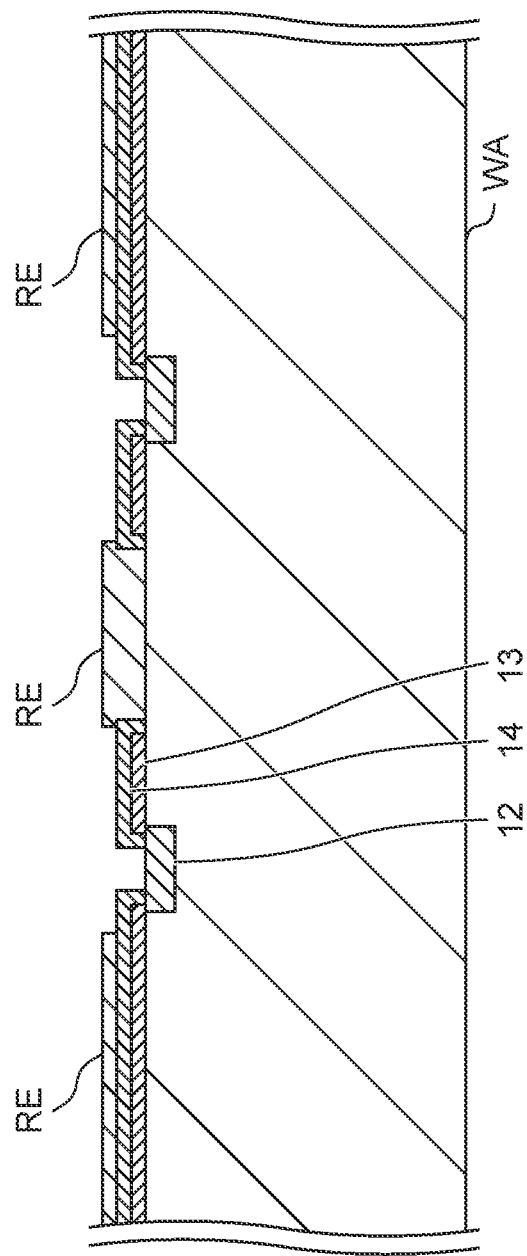
FIG. 10 is a cross-sectional view in one step in manufacturing the semiconductor device according to the embodiment of the present application.

Next, as illustrated in FIG. 10, a resist film RE is formed on portions excluding portions at which the post base portions 21 of the electrode posts 20 are formed on the upper surface of the wafer WA (Step S103). The resist film RE is applied over the upper surface of the wafer WA, exposure and development are performed to open the portions at which the post base portions 21 are formed, thus etching the openings. For the etching of the resist film RE, for example, a wet etching is performed using a chemical liquid of tetramethylammonium hydroxide (TMAH) or the like.

Figure 11:
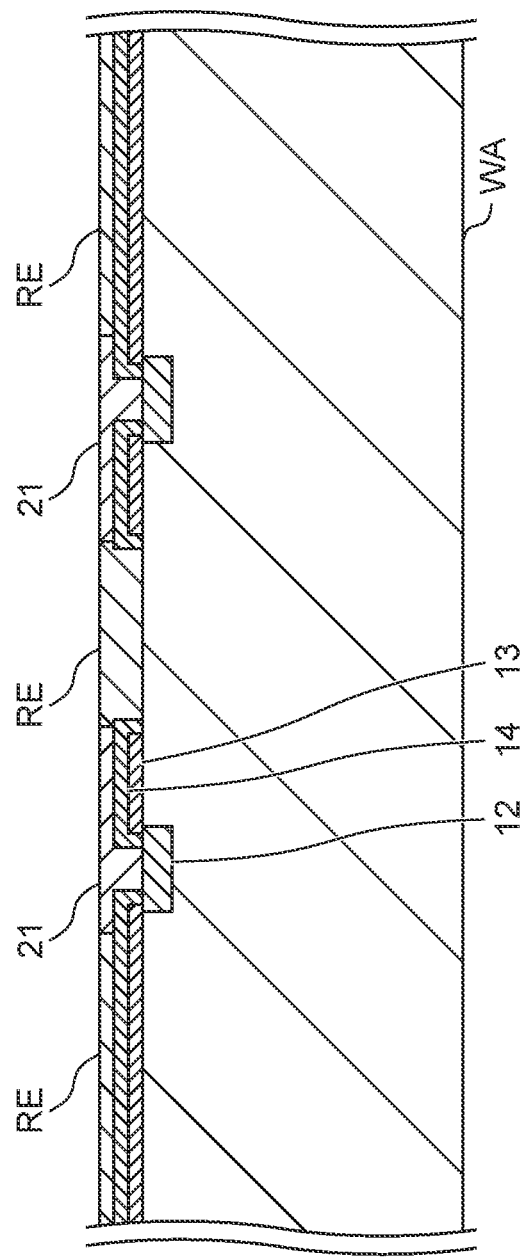
FIG. 11 is a cross-sectional view in one step in manufacturing the semiconductor device according to the embodiment of the present application.

Next, as illustrated in FIG. 11, the post base portions 21 are formed in the openings of the resist film RE (Step S104). The post base portion 21 is formed on, for example, the seed layer of Ti/Cu formed by the plating at Step S102.

Figure 12:
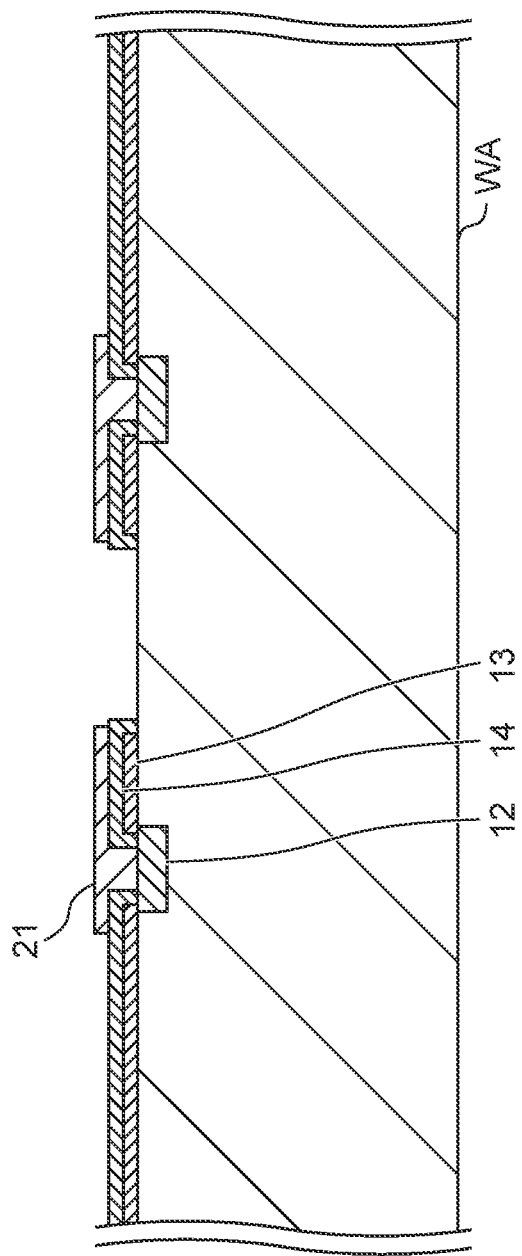
FIG. 12 is a cross-sectional view in one step in manufacturing the semiconductor device according to the embodiment of the present application.

Next, as illustrated in FIG. 12, the resist film RE formed on the wafer WA is removed (Step S105).

Figure 13:
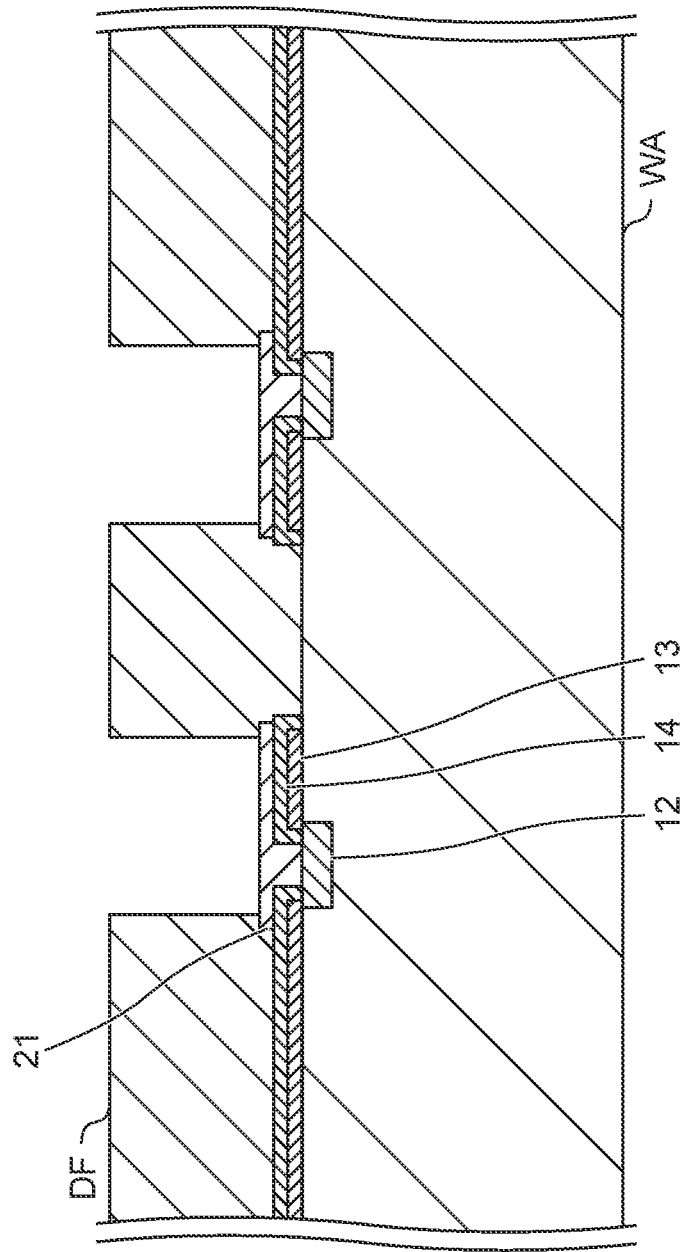
FIG. 13 is a cross-sectional view in one step in manufacturing the semiconductor device according to the embodiment of the present application.

Next, as illustrated in FIG. 13, a dry film DF is attached on the wafer WA, exposure and development are performed to provide openings on the upper surfaces of the post base portions 21, thus removing the dry film DF of the openings (Step S106). In this respect, an opening area of the dry film DF in top view is preferably smaller than an area of the upper surface of the post base portion 21.

Figure 14:
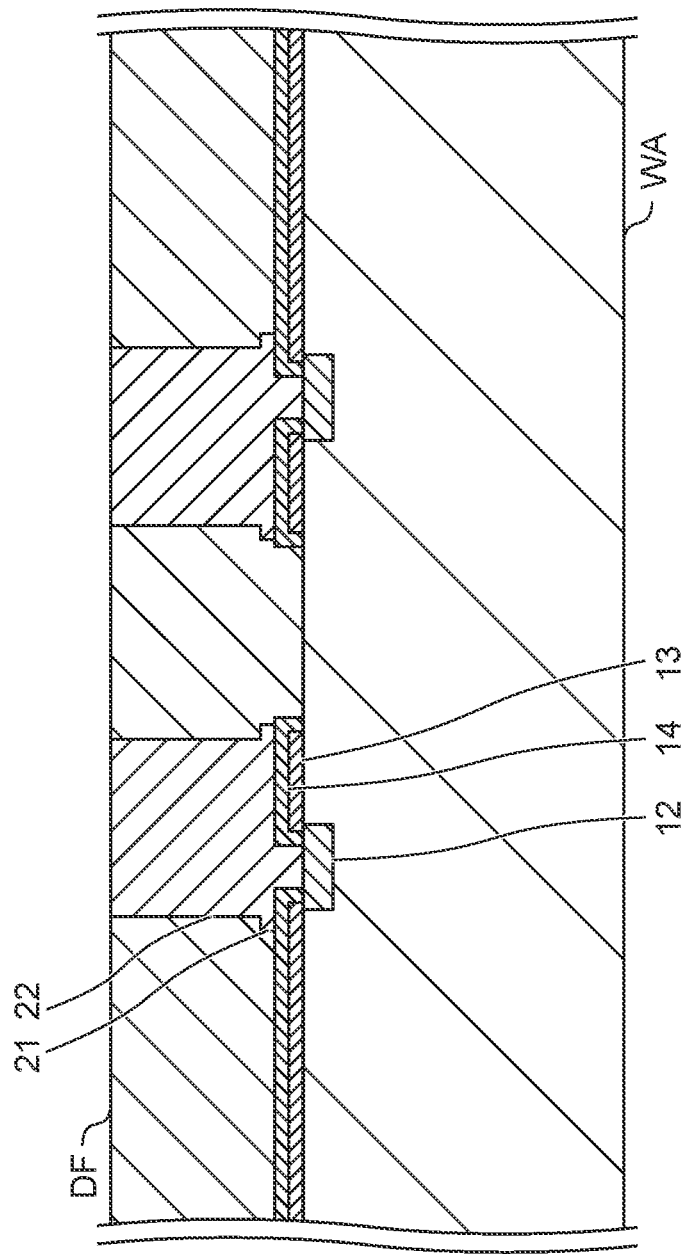
FIG. 14 is a cross-sectional view in one step in manufacturing the semiconductor device according to the embodiment of the present application.

Next, as illustrated in FIG. 14, the post main bodies 22 are formed in the openings of the dry film DF (Step S107). For example, the post main body 22 is formed on the post base portion 21 in the opening of the dry film DF by plating. In this respect, a height from the electrode pad 12 to the upper surface of the post main body 22 including the post base portion 21 is formed to be about 130 μm.

Figure 15:
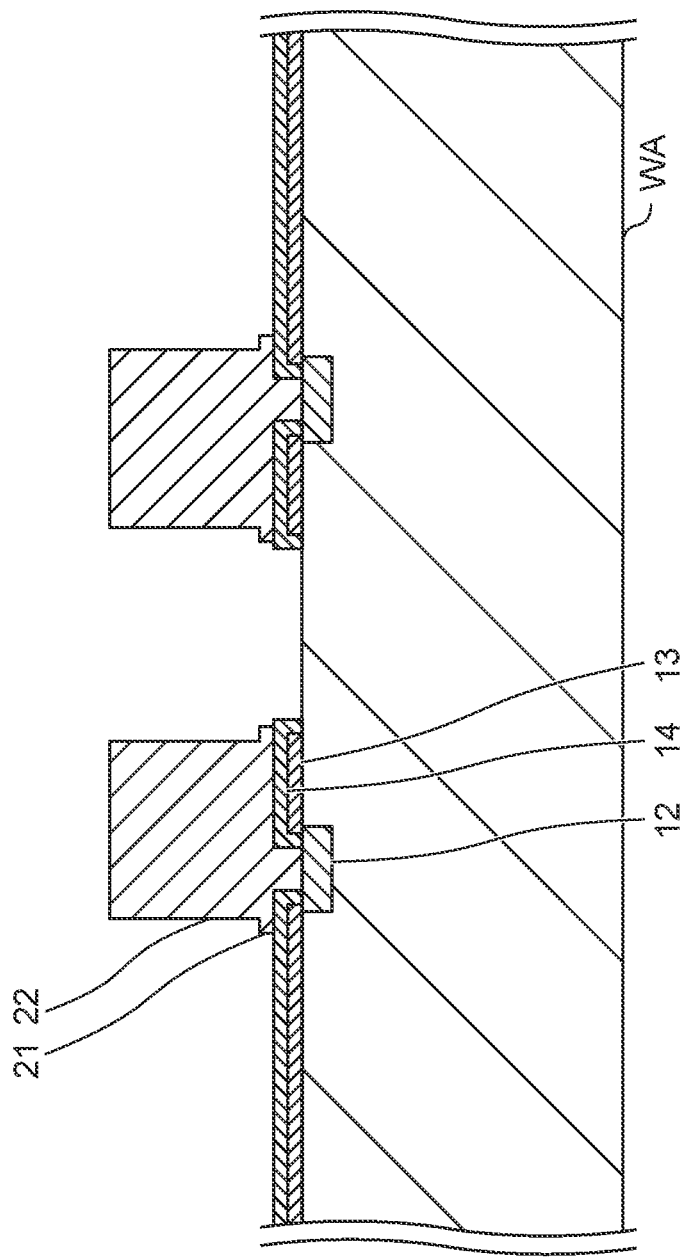
FIG. 15 is a cross-sectional view in one step in manufacturing the semiconductor device according to the embodiment of the present application.

Next, as illustrated in FIG. 15, the dry film DF attached on the wafer WA is removed (Step S108).

Next, the seed layer of Ti/Cu formed at Step S102 is removed (Step S109). In this step, the seed layer remaining on the portion excluding the portion forming the electrode post 20, mainly the scribe line SL and the upper surface of the insulating film 14, is removed. Thus, the electrode posts 20 are mutually electrically insulated.

Figure 16:
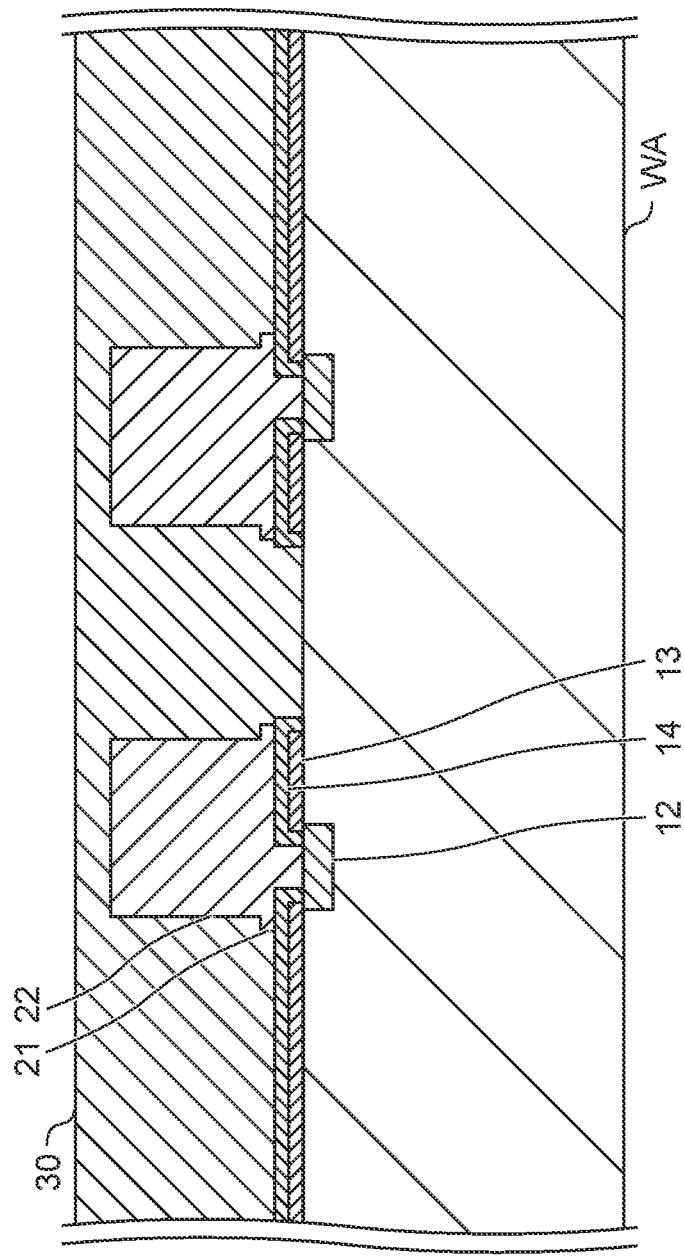
FIG. 16 is a cross-sectional view in one step in manufacturing the semiconductor device according to the embodiment of the present application.

Next, as illustrated in FIG. 16, the sealing resin 30 is formed to cover the upper surface of the wafer WA (Step S110). In this respect, a height from the upper surface of the wafer WA to the upper surface of the sealing resin 30 is formed to be about 200 to 300 μm. As illustrated in FIG. 16, the sealing resin 30 is formed to cover the upper surfaces of the electrode posts 20.

Figure 17:
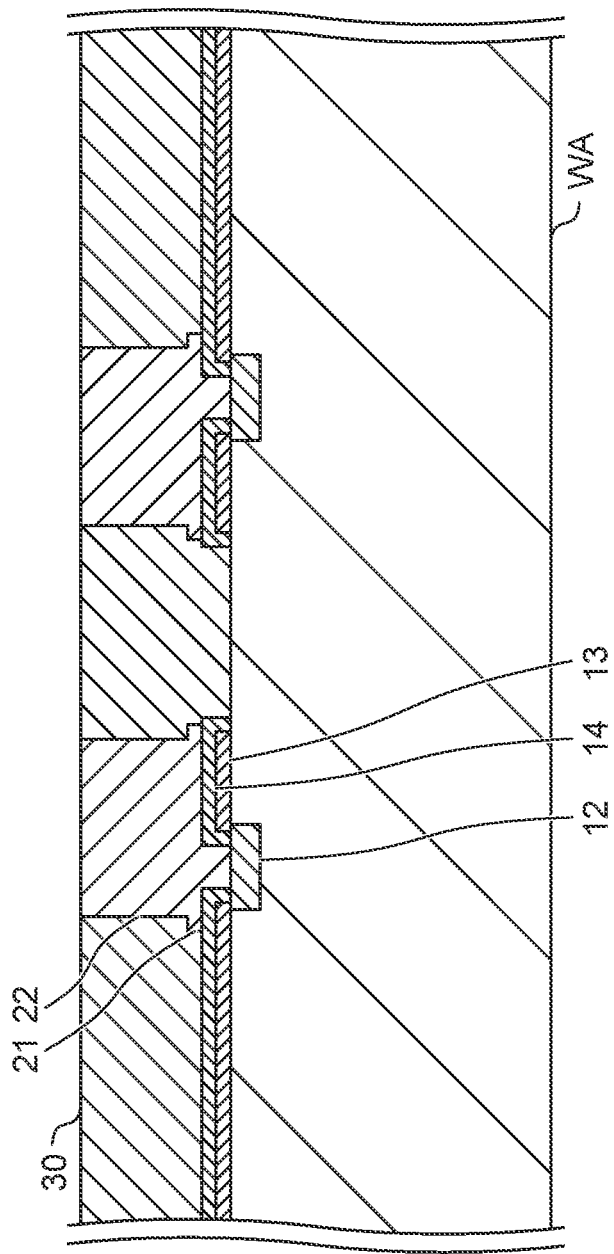
FIG. 17 is a cross-sectional view in one step in manufacturing the semiconductor device according to the embodiment of the present application.

Next, as illustrated in FIG. 17, grinding is performed from the surface of the sealing resin 30 of the wafer WA to expose the upper surfaces of the electrode posts 20 (Step S111). In this respect, a height from the upper surface of the wafer WA to the upper surface of the electrode post 20 and the sealing resin 30 is about 80 μm.

Steps S101 to S111 described above are performed as an electrode structure formation process in which the post base portion 21 and the post main body 22 of the electrode post 20 as a metal terminal and the sealing resin 30 are formed on the upper surface of the semiconductor element 10.

Figure 18:
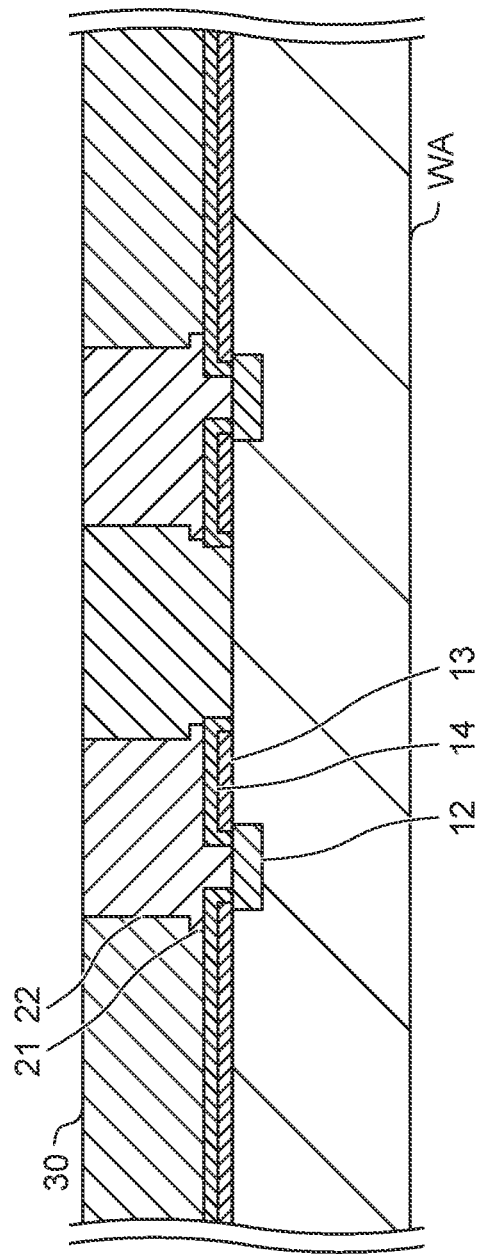
FIG. 18 is a cross-sectional view in one step in manufacturing the semiconductor device according to the embodiment of the present application.

Next, as illustrated in FIG. 18, grinding of the wafer WA is performed from the lower surface side of the wafer WA (Step S112).

Figure 19:
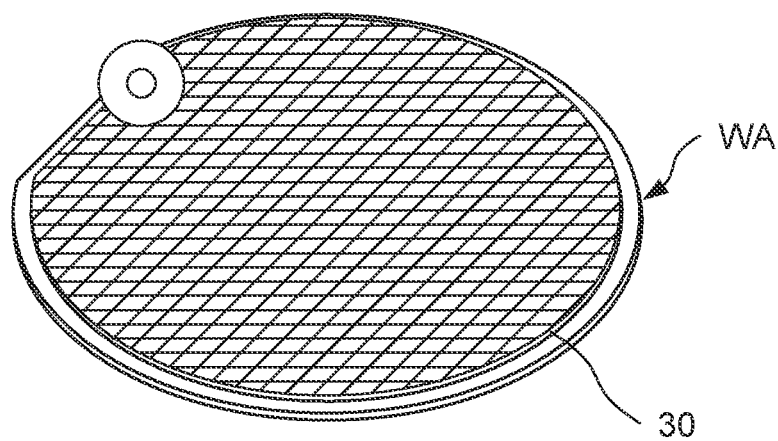
FIG. 19 is a drawing illustrating a wafer state in one step in manufacturing the semiconductor device according to the embodiment of the present application.
Figure 20:
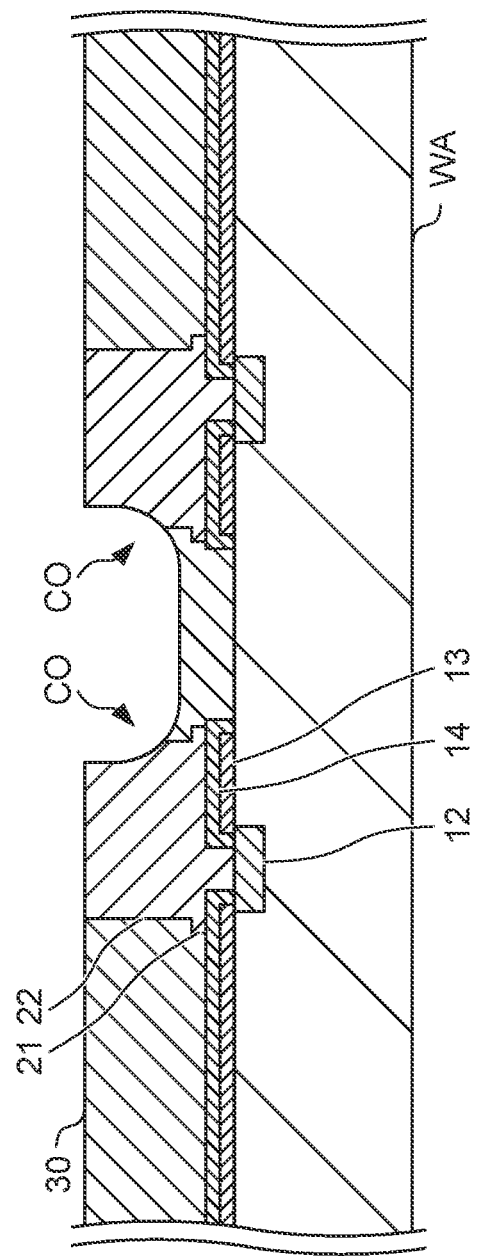
FIG. 20 is a cross-sectional view in one step in manufacturing the semiconductor device according to the embodiment of the present application.

Next, as illustrated in FIG. 19, as a terminal formation process, the wafer WA is set in a dicing machine, and half cutting of the sealing resin 30 formed on the upper surface of the wafer WA is performed (Step S113). In this half cutting, as illustrated in FIG. 20, the electrode post 20 is partially cut in the side surface of the electrode post 20 on the end portion side of the semiconductor device 100. In the half cutting process, the cutout structure CO having the width wider than that of the scribe line SL is provided to the portion corresponding to the end portion of the semiconductor device 100 in the sealing resin 30 formed on the upper surface of the semiconductor element 10. The half cutting process is performed such that at least a part of the post main body 22 is exposed from the surface formed by the cutout structure CO. A dicing blade used for the half cutting has a blade width of, for example, about 120 μm. A depth of performing the half cutting is, for example, about 50 μm from the upper surface of the electrode post 20 and the sealing resin 30.

Next, the upper surfaces of the electrode posts 20 exposed from the upper surface of the sealing resin 30 and the side surfaces of the electrode posts 20 exposed at Step S113 are cleaned (Step S114). The cleaning of the exposed surfaces of the electrode posts 20 is performed by partially etching the exposed surfaces of the electrode posts 20 by chemical polishing. Accordingly, cutting burrs and the like of the exposed surfaces of the electrode posts 20 generated in the upper surface grinding of the sealing resin 30 performed at Step S111 and the half cutting performed at Step S113 can be removed.

Figure 21:
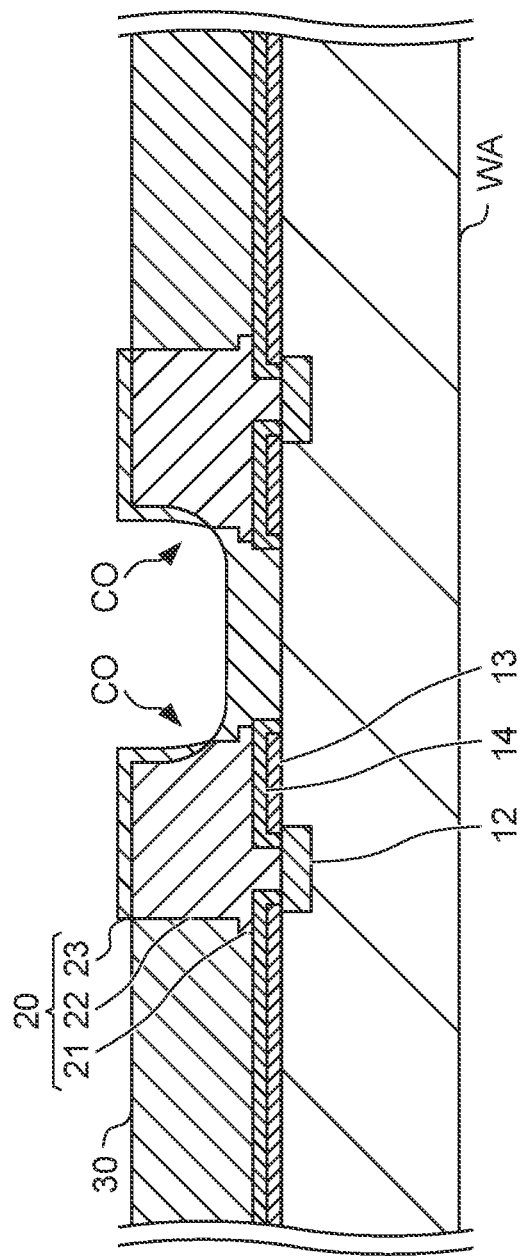
FIG. 21 is a cross-sectional view in one step in manufacturing the semiconductor device according to the embodiment of the present application.
Figure 22:
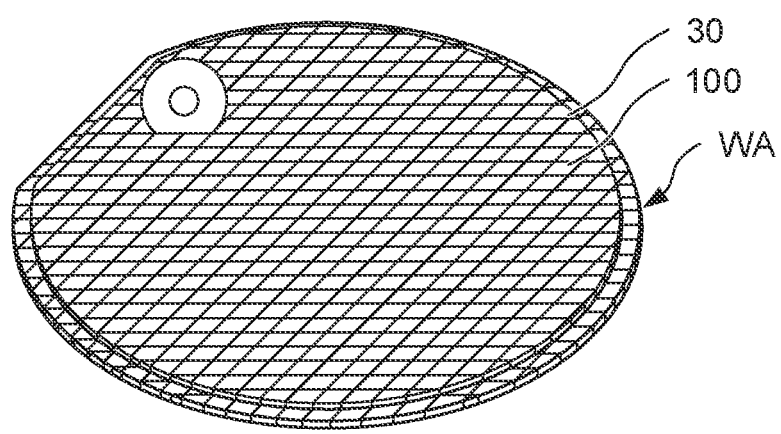
FIG. 22 is a cross-sectional view in one step in manufacturing the semiconductor device according to the embodiment of the present application.

Next, as illustrated in FIG. 21, the antioxidation film 23 is formed on the exposed surfaces of the electrode posts 20 (Step S115). As described above, the antioxidation film 23 is a Sn plating film formed by an electroless plating.

Steps S113 to S115 described above are performed as a terminal formation process to form the electrode posts 20 as the metal terminals.

Figure 23:
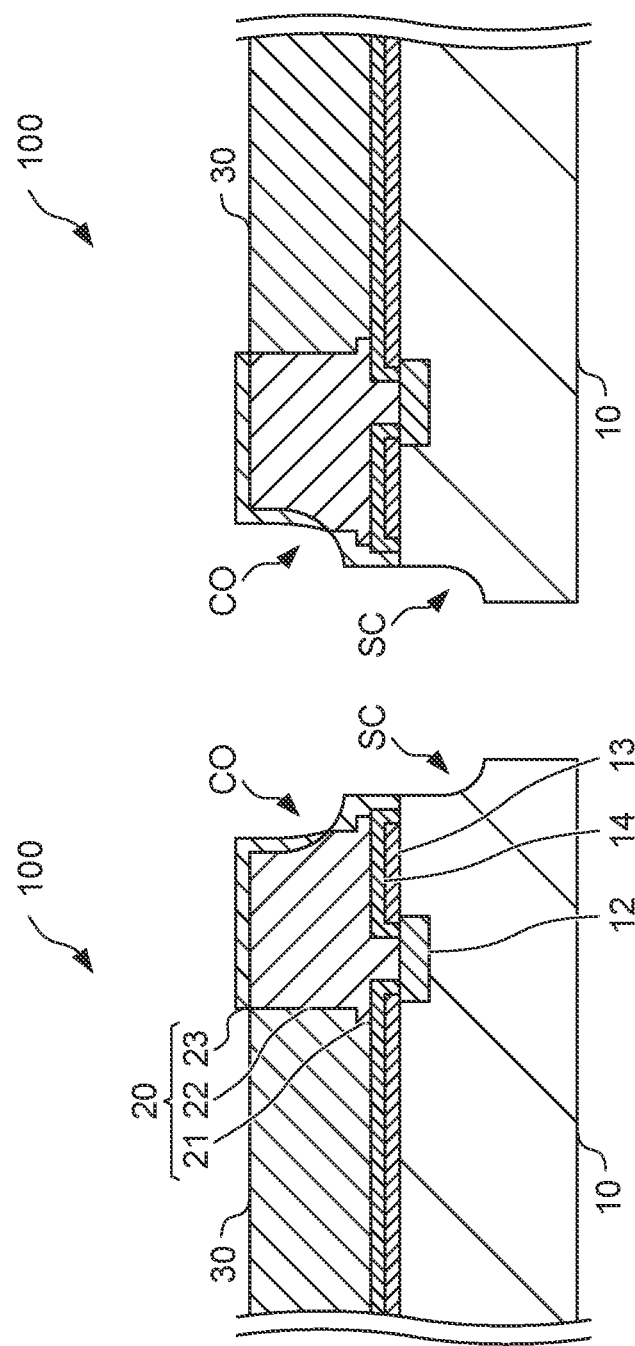
FIG. 23 is a cross-sectional view in one step in manufacturing the semiconductor device according to the embodiment of the present application.

Next, as a dicing process, as illustrated in FIG. 22, the wafer WA is set in the dicing machine, and the semiconductor device 100 is individualized (Step S116). The individualization of the semiconductor device 100 is preferably performed by step cutting for avoiding chipping and the like. The individualization of the semiconductor device 100 is performed to the center line of a trench formed in the half cutting performed at Step S113. In the individualization, for example, the cutting is made with a dicing blade having a dicing blade width of about 40 to 45 μm, and then, for example, the wafer WA is cut with the dicing blade having the dicing blade width of about 30 to 35 μm. Accordingly, as illustrated in FIG. 23, the cutout SC is formed also in the side surface of the semiconductor element 10.

By performing the processes of Steps S101 to S116 described above, the semiconductor device 100 of the embodiment is manufactured.

As described above, the method for manufacturing the semiconductor device 100 of the embodiment includes: the electrode structure formation process of forming the electrode structure on the semiconductor element 10 including a plurality of electrode pads 12 formed of conductors on one surface, the electrode structure including the post base portions 21 and the post main bodies 22 as a plurality of metal terminals formed of conductors and the sealing resin 30, the post base portions 21 and the post main bodies 22 being disposed along the circumference of the one surface on the one surface and electrically connected to the respective plurality of electrode pads 12, the sealing resin 30 holding the post base portions 21 and the post main bodies 22 and being formed to cover the one surface of the semiconductor element 10, the electrode structure including a first surface opposed to the one surface of the semiconductor element 10 and a second surface positioned in the opposite side of the first surface; the terminal formation process of exposing each of the plurality of post base portions 21 and post main bodies 22 from the sealing resin 30 in at least a part of the second surface of the electrode structure and at least a part of a third surface that is positioned between the first surface and the second surface and continuous with the second surface; and the dicing process of individualizing the plurality of semiconductor devices 100 formed on the wafer.

The method for manufacturing the semiconductor device 100 of the embodiment further includes the half cutting process of forming the cutout structure CO on the upper end of the third surface along the circumference of the second surface in the electrode structure and exposing the post main bodies 22 from the sealing resin 30 in the cutout structure CO of the third surface in the terminal formation process.

As described above, the semiconductor device 100 of the embodiment has the configuration in which the electrode posts 20 formed on the electrode pads 12 disposed on the upper surface as the device surface of the semiconductor element 10 are exposed from the side surface of the semiconductor device 100. Accordingly, the WL-CSP semiconductor device that allows visually confirming the mounted state of the semiconductor device after mounting the semiconductor device to the mounting board, and the method for manufacturing the same can be provided.

[Modification 1]

In the embodiment, the case where the antioxidation film 23 is formed on the exposed surfaces of the post main bodies 22 of the electrode posts 20 exposed from the sealing resin 30 has been described. However, the antioxidation film 23 may be omitted.

Figure 24:
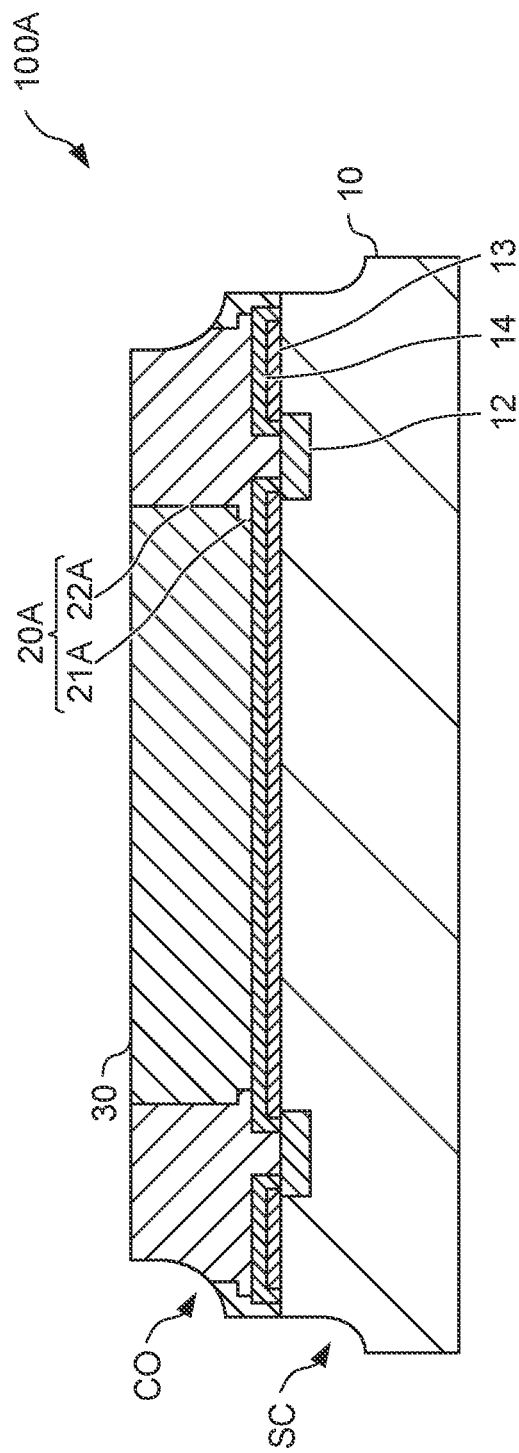
FIG. 24 is a cross-sectional view of a semiconductor device according to Modification 1 of present application.

FIG. 24 is a cross-sectional view of a semiconductor device 100A of Modification 1 of the embodiment. FIG. 24 illustrates a cross-sectional surface at the position similar to that of the semiconductor device 100 illustrated in FIG. 4.

The semiconductor device 100A has a configuration basically the same as the configuration of the semiconductor device 100 described in the embodiment. The semiconductor device 100 of the embodiment is described with the structure that includes the antioxidation film 23 formed to cover the upper surfaces and the cutouts of the post main bodies 22 formed to be exposed from the sealing resin 30. Modification 1 is different in that the antioxidation film 23 is not formed on the exposed upper surfaces or cutouts of post main bodies 22A.

That is, in the semiconductor device 100A, the post main bodies 22A of electrode posts 20A are exposed at a part of the upper surface and the cutout structure CO.

A post base portion 21A and the post main body 22A of the electrode post 20A are, for example, conductors made of an alloy of tin-argentum (Sn—Ag), tin-argentum-copper (Sn—Ag—Cu), or the like. In this modification, a case where the post base portion 21A and the post main body 22A are made of Sn—Ag will be described.

In the method for manufacturing the semiconductor device 100A of Modification 1, at Step S104 and Step S107 illustrated in FIG. 5, each of the post base portion 21A and the post main body 22A of the electrode post 20A is formed by the plating. In Modification 1, the third plating process of Step S115 in the process flowchart illustrated in FIG. 6 can be omitted. The other processes of Steps S101 to S114, and Step S116 are similar to those in the method for manufacturing the semiconductor device 100 in the embodiment.

As described above, with the post base portion 21A and the post main body 22A of the electrode post 20A made of the alloy of Sn—Ag or the like, the poor mounting due to the oxidation and the like of the exposed surface of the electrode post 20A can be avoided in the mounting to the mounting board. The plating process for forming the antioxidation film 23 can be omitted, thus allowing facilitating the manufacture of the semiconductor device 100A.

In Modification 1, similarly to the embodiment, the semiconductor device 100A has a configuration in which the electrode posts 20A formed on the electrode pads 12 arranged on the upper surface as the device surface of the semiconductor element 10 are exposed from the side surfaces of the semiconductor device 100A. Accordingly, similarly to the embodiment, the mounted state of the semiconductor device 100A can be visually confirmed after the mounting to the mounting board.

When Sn—Ag—Cu is used for the post base portion 21A and the post main body 22A, the processes of Step S103 to Step S105 illustrated in FIG. 5 can be omitted. Specifically, by filling Sn—Ag—Cu in the openings of the dry film DF formed at Step S107 by solder printing, the post base portion 21A and the post main body 22A may be collectively formed.

[Modification 2]

In the embodiment, the case where the sealing resin 30 is provided with the cutout portion forming a part of the cutout structure CO formed from the upper ends of the side surfaces along the circumference of the one surface of the semiconductor element 10, and the side surfaces of the post main bodies 22 are exposed from the sealing resin 30 in the cutout portion has been described. However, the exposure structure of the electrode post 20 is not limited to this.

Figure 25:
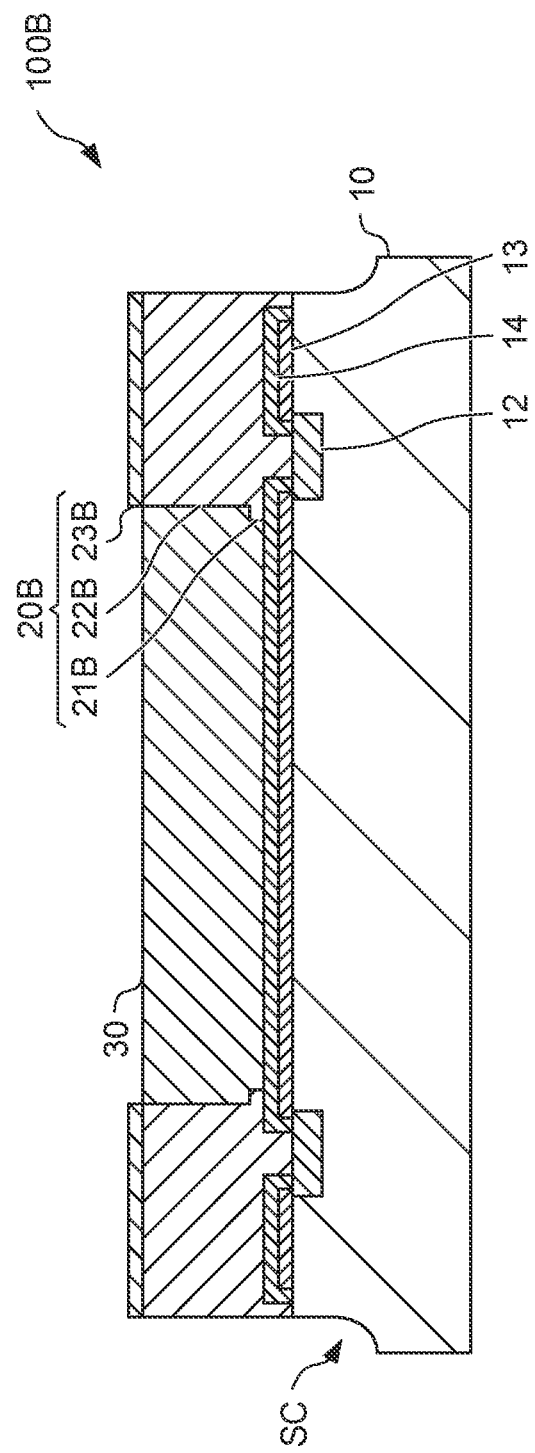
FIG. 25 is a cross-sectional view of a semiconductor device according to Modification 2 of present application.

FIG. 25 is a cross-sectional view of a semiconductor device 100B of Modification 2 of the embodiment. FIG. 25 illustrates a cross-sectional surface at the position similar to that of the semiconductor device 100 illustrated in FIG. 4.

The semiconductor device 100B has a configuration basically the same as the configuration of the semiconductor device 100 described in the embodiment. The semiconductor device 100 of the embodiment is described with the structure in which the cutout portion is provided at the upper ends of the side surface of the sealing resin 30, and the side surfaces of the post main bodies 22 are not exposed from the side surfaces of the sealing resin 30 in the portion excluding the cutout portion.

Modification 2 is different in that the cutout portion is not provided to the side surface of the sealing resin 30, and post main bodies 22B of electrode posts 20B are exposed from the lower end to the upper end of the side surface of the sealing resin 30.

That is, the electrode post 20B is formed from the electrode pad 12 to the scribe line on the side near the semiconductor element 10, the semiconductor devices 100B are cut by step cutting to be individualized, and the post main body 22B is exposed from the side surface of the sealing resin 30.

In the method for manufacturing the semiconductor device 100B of Modification 2, as described above, the half cutting process of the sealing resin 30 at Step S113 in the process flowchart illustrated in FIG. 6 can be omitted. After performing the grinding of the upper surface of the sealing resin 30 and the lower surface of the wafer WA at Steps S111 and S112, the cleaning of the upper surface of the post main body 22B at Step S114 and the Sn plating as an antioxidation film 23B at Step S115 are performed to the upper surface of the post main body 22B exposed from the upper surface of the sealing resin 30. Subsequently, the semiconductor devices 100B are individualized by step cutting in the dicing process at Step S116. Accordingly, the antioxidation film 23B is formed only on the upper surface of the electrode post 20B.

In Modification 2, similarly to the embodiment, the semiconductor device 100B has a configuration in which the electrode posts 20B formed on the electrode pads 12 arranged on the upper surface as the device surface of the semiconductor element 10 are exposed from the side surfaces of the semiconductor device 100B. Accordingly, similarly to the embodiment, the mounted state of the semiconductor device 100B can be visually confirmed after the mounting to the mounting board.

[Modification 3]

In the semiconductor device 100 of the embodiment, the case of the Fan-in type WL-CSP structure in which the external terminals including the electrode posts 20 are formed inward from the outer circumference of the semiconductor element 10 in top view has been described. However, the structure of the semiconductor device is not limited to this.

Figure 26:
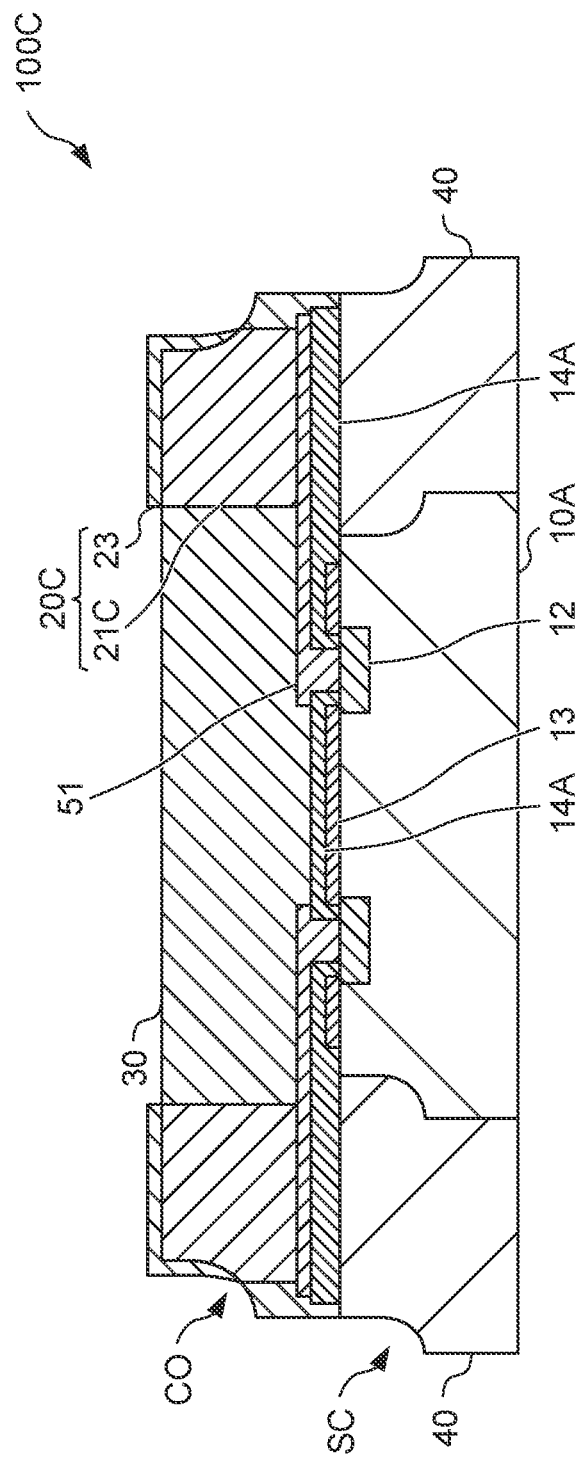
FIG. 26 is a cross-sectional view of a semiconductor device according to Modification 3 of present application.

FIG. 26 is a cross-sectional view of a semiconductor device 100C of Modification 3 of the embodiment. FIG. 26 illustrates a cross-sectional surface at the position similar to that of the semiconductor device 100 illustrated in FIG. 4.

The semiconductor device 100C has a configuration basically the same as the configuration of the semiconductor device 100 described in the embodiment. The semiconductor device 100C of Modification 3 includes an expanded resin portion 40 that surrounds an outer periphery portion of a semiconductor element 10A. The semiconductor device 100C includes an insulating film 14A that covers the upper surface and the side surface of the surface protection film 13 of the semiconductor element 10A and extends to the upper surface of the expanded resin portion 40 outside the outer peripheral end of the semiconductor element 10A. The semiconductor device 100C includes a rewiring 51 that is formed on the upper surfaces of the semiconductor element 10A and the insulating film 14A, rewires each of the electrode pads 12 of the semiconductor element 10A to outside the outer peripheral end of the semiconductor element 10A, and electrically connects the electrode pads 12 to electrode posts 20C.

The expanded resin portion 40 is an insulating resin, such as an epoxy resin. The rewiring 51 is a metal wire made of Cu or the like. The insulating film 14A is an insulating resin film of polyimide (PI), polybenzoxazole (PBO), or the like.

While the electrode post 20C has a configuration basically the same as that in the semiconductor device 100 described in the embodiment, the electrode post 20C is different from the embodiment in that the electrode post 20C is not formed on the upper surface of the electrode pad 12 of the semiconductor element 10A. As described above, the electrode post 20C is formed so as to be positioned outward the outer peripheral end of the semiconductor element 10A via the rewiring 51. That is, the semiconductor device 100C of Modification 3 is a Fan Out Wafer Level Package (FOWLP) in which the external terminals including the electrode posts 20C are formed on the rewiring 51 formed outward from the outer circumference of the semiconductor element 10A in top view.

In the method for manufacturing the semiconductor device 100C of Modification 3, after the diffusion process of the wafer WA, the grinding is performed, and the dicing is performed, thus individualizing the semiconductor elements 10A. The individualized semiconductor elements 10A are rearranged to be mutually separated with voids at predetermined intervals on a support substrate, and a resin is filled in respective voids of the semiconductor elements 10A, thus forming the expanded resin portions 40. The support substrate is removed after hardening the expanded resin portion 40.

Next, the insulating film 14A and the rewiring 51 are formed on the upper surfaces of the semiconductor element 10A and the expanded resin portion 40. The rewiring 51 is stacked on the insulating film 14A so as to electrically connect the electrode pad 12 and a formation position of a post main body 21C.

Subsequently, similarly to the method for manufacturing the semiconductor device 100 of the embodiment, the processes following Step S105 illustrated in FIG. 5 are performed, and the electrode post 20C and the sealing resin 30 as the electrode structure are formed on the upper surface of the rewiring 51.

Accordingly, also in the semiconductor element 10A having a small chip size, the external terminals including the electrode posts 20C can be formed outward from the outer circumference of the semiconductor element 10A, thus allowing providing the semiconductor device 100C having a mountability similar to that of the embodiment. Also in the semiconductor device 100C, similarly to the embodiment, the mounted state of the semiconductor device 100C can be visually confirmed after the mounting to the mounting board.

The embodiment and Modifications 1, 2, and 3 described above are merely examples. For example, the various kinds of the embodiment and Modifications 1, 2, and 3 described above can be combined. For example, the semiconductor device 100 may include the rewiring 51 of the semiconductor device 100C so as to appropriately change the position of the electrode post 20 corresponding to the electrode pad 12 of the semiconductor element 10. The semiconductor device 100C may include the electrode post exposed from the entire surface of the side surface of the sealing resin 30 like the electrode post 20B of the semiconductor device 100B without performing the half cutting process of the sealing resin 30. The semiconductor device 100B or 100C may include the electrode post 20A, which is made of the alloy of Sn—Ag or the like, of the semiconductor device 100A and need not include the antioxidation film 23.

It is understood that the foregoing description and accompanying drawings set forth the preferred embodiments of the present invention at the present time. Various modifications, additions and alternative designs will, of course, become apparent to those skilled in the art in light of the foregoing teachings without departing from the spirit and scope of the disclosed invention. Thus, it should be appreciated that the present invention is not limited to the disclosed Examples but may be practiced within the full scope of the appended claims. This application is based upon and claims the benefit of priority from the prior Japanese Patent Application No. 2020-165426 filed on Sep. 30, 2020, the entire contents of which are incorporated herein by reference.

What is claimed is:

1. A semiconductor device comprising:
   a semiconductor element having one surface with a plurality of electrode pads made of a conductor; and
   an electrode structure including a plurality of metal terminals made of a conductor and a sealing resin, the plurality of metal terminals being disposed in a region along a circumference of the one surface on the one surface and electrically connected to the respective plurality of electrode pads, the sealing resin holding the plurality of metal terminals and being disposed on the one surface of the semiconductor element to cover the one surface, wherein
   the electrode structure includes a first surface opposed to the one surface of the semiconductor element, a second surface positioned in an opposite side of the first surface, and a third surface positioned between the first surface and the second surface and continuous with the second surface, and
   each of the plurality of metal terminals is exposed from the sealing resin in at least a part of the second surface and at least a part of the third surface.

2. The semiconductor device according to claim 1, wherein
   the plurality of metal terminals are partially covered with the sealing resin from end portions near the semiconductor element in the third surface.

3. The semiconductor device according to claim 2, wherein
   the electrode structure is provided with a cutout formed along a circumference of the second surface, and the metal terminal is exposed from the sealing resin at the cutout portion in the third surface.

4. The semiconductor device according to claim 1, comprising
   an antioxidation film that at least partially covers the surfaces of the plurality of metal terminals exposed from the sealing resin.

5. The semiconductor device according to claim 1, wherein
   the semiconductor device is a WL-CSP.

6. A method for manufacturing a semiconductor device, comprising:
   forming an electrode structure on a semiconductor element having one surface with a plurality of electrode pads made of a conductor, the electrode structure including a plurality of metal terminals made of a conductor and a sealing resin, the metal terminals being disposed in a region along a circumference of the one surface, on the one surface, and electrically connected to the respective plurality of electrode pads, the sealing resin holding the plurality of metal terminals and being formed on the one surface of the semiconductor element to cover the one surface, the electrode structure including a first surface opposed to the one surface and a second surface positioned in an opposite side of the first surface;
   exposing each of the plurality of metal terminals from the sealing resin in at least a part of the second surface of the electrode structure and at least a part of a third surface positioned between the first surface and the second surface and continuous with the second surface; and
   individualizing a plurality of the semiconductor devices formed on a wafer.

7. The method for manufacturing the semiconductor device according to claim 6, wherein
   the exposing further includes a half cutting in which the electrode structure is provided with a cutout formed along a circumference of the second surface at an upper end of the third surface, and the plurality of metal terminals are exposed from the sealing resin at the cutout portion in the third surface.

* * * * *